(12) United States Patent
Cherry et al.

(10) Patent No.: US 10,393,598 B1
(45) Date of Patent: Aug. 27, 2019

(54) HEAT FLUX GAGE

(71) Applicant: FluxTeq LLC, Blacksburg, VA (US)

(72) Inventors: Rande James Cherry, Blacksburg, VA (US); Christopher Francis Cirenza, Blacksburg, VA (US); Thomas Eugene Diller, Blacksburg, VA (US)

(73) Assignee: FluxTeq LLC, Blacksburg, VA (US)

( * ) Notice: Subject to any disclaimer, the term of this patent is extended or adjusted under 35 U.S.C. 154(b) by 94 days.

(21) Appl. No.: 15/369,562

(22) Filed: Dec. 5, 2016

Related U.S. Application Data

(60) Provisional application No. 62/262,429, filed on Dec. 3, 2015.

(51) Int. Cl.
| | |
|---|---|
| *G01N 25/02* | (2006.01) |
| *G01K 17/00* | (2006.01) |
| *H01L 35/04* | (2006.01) |
| *H01L 35/32* | (2006.01) |
| *H01L 35/34* | (2006.01) |

(52) U.S. Cl.
CPC .............. *G01K 17/00* (2013.01); *H01L 35/04* (2013.01); *H01L 35/325* (2013.01); *H01L 35/34* (2013.01)

(58) Field of Classification Search
CPC combination set(s) only.
See application file for complete search history.

(56) References Cited

U.S. PATENT DOCUMENTS

| | | | |
|---|---|---|---|
| 3,607,445 A | 9/1971 | Hines | |
| 4,197,738 A | 4/1980 | Degenne | |
| 4,567,365 A * | 1/1986 | Degenne | G01J 5/12 136/224 |
| 4,577,976 A | 3/1986 | Hayashi et al. | |
| 4,722,609 A | 2/1988 | Epstein et al. | |

(Continued)

OTHER PUBLICATIONS

Diller, T. E., "Heat Flux Measurement," Ch. 18, in Handbook of Measurement in Science and Engineering, Ed. M. Kutz, John Wiley & Sons, NY, 2013, pp. 629-659.

(Continued)

*Primary Examiner* — Lisa M Caputo
*Assistant Examiner* — Nasir U. Ahmed
(74) *Attorney, Agent, or Firm* — Johnston Holroyd; Mary-Jacq Holroyd

(57) ABSTRACT

Metal interconnect layers on a top surface connected through holes to interconnect layers of the same or interconnect layers of a thermoelectrically different material on a bottom surface material on the bottom surface. Through hole connection provided by a material of the same or similar thermoelectric material as interconnects. A second metal of a thermoelectrically different material than the first interconnect layer is connected through a second hole from the top side interconnect to the bottom side interconnect. A second through hole connection provided by a metal of the same or similar thermoelectric material as the interconnect layer on the bottom side. Layers are connected in an alternating fashion to form a differential thermocouple. The pattern is created by printing conductive metallic inks on the surfaces and through holes, or by a combination of plating and etching processes and printing conductive metallic inks on the surfaces and through holes.

11 Claims, 6 Drawing Sheets

(56) References Cited

U.S. PATENT DOCUMENTS

| | | | | |
|---|---|---|---|---|
| 4,779,994 | A * | 10/1988 | Diller | G01K 17/20 |
| | | | | 136/225 |
| 5,393,351 | A | 2/1995 | Kinard et al. | |
| 5,990,412 | A | 5/1999 | Terrell | |
| 6,278,051 | B1 | 8/2001 | Peabody | |
| 6,186,661 | B1 | 9/2001 | Hevey et al. | |
| 6,821,015 | B2 | 11/2004 | Hammer et al. | |
| 8,016,480 | B2 | 9/2011 | Lozinski et al. | |
| 8,104,952 | B2 | 1/2012 | Yoo et al. | |
| 9,029,180 | B2 * | 5/2015 | Britton | G01K 7/226 |
| | | | | 438/171 |
| 9,127,988 | B2 | 9/2015 | Ikeda et al. | |
| 9,659,416 | B2 * | 5/2017 | Tanaka | B60R 16/023 |
| 2004/0136434 | A1 | 7/2004 | Langley | |
| 2005/0105582 | A1 | 5/2005 | Thery et al. | |
| 2007/0181650 | A1 * | 8/2007 | Yoo | G01K 17/20 |
| | | | | 228/101 |
| 2015/0308906 | A1 | 10/2015 | Durer et al. | |

OTHER PUBLICATIONS

Diller, T. E., "Heat Flux," Ch. 67, in Measurement, Instrumentation and Sensors Handbook, Eds. J. G. Webster and H. Eren, CRC Press, Boca Raton, Florida, 2014, pp. 67.1-15.

ASTM E2684-09, Standard Test Method for Measuring Heat Flux Using Surface-Mounted One-Dimensional Flat Gages. Ann. Book ASTM Standards, 15.03, 2009.

Degenne, M. and Klarsfeld, S., "A New Type of Heat Flowmeter for Application and Study of Insulation and Systems," In Building Applications of Heat Flux Transducers, ASTM STP 885, Eds. E. Bales, M. Bomberg, and G. E. Courville, ASTM, Philadelphia, 1985, pp. 163-171.

* cited by examiner

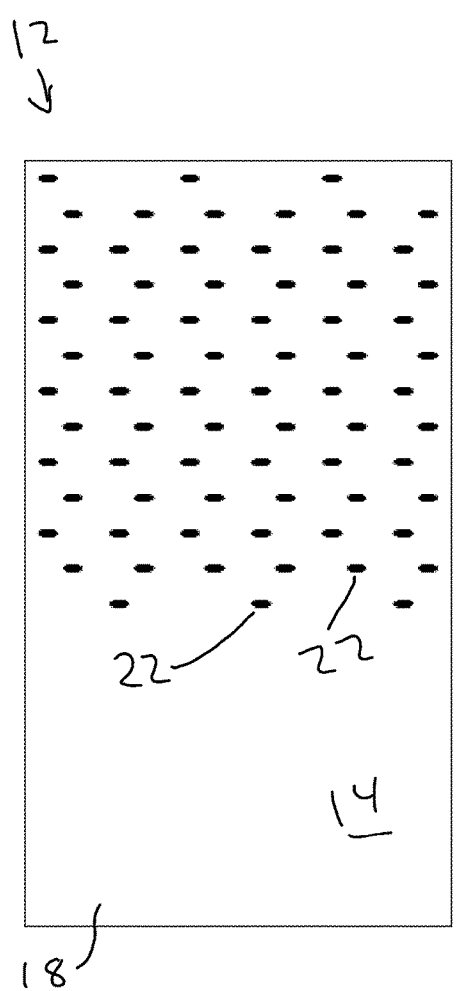
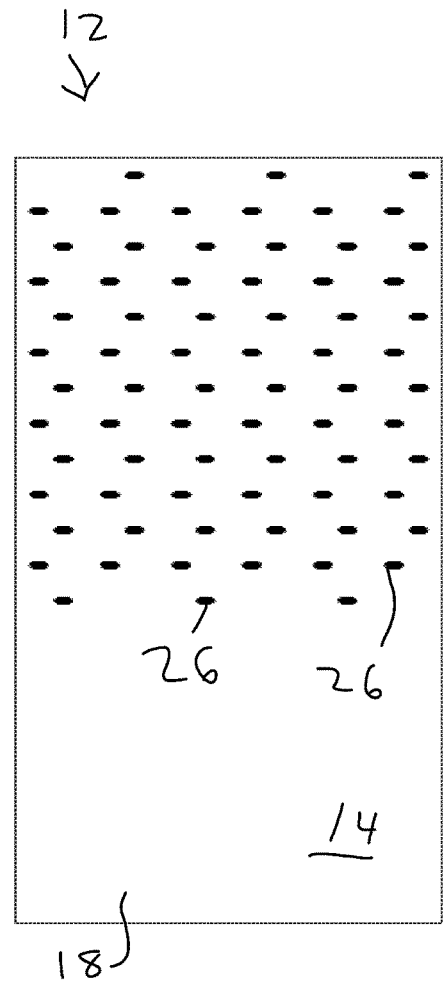
FIG. 4A
FIG. 4B

US 10,393,598 B1

HEAT FLUX GAGE

RELATED APPLICATIONS

This application claims the benefit of U.S. Provisional Application Ser. No. 62/262,429 entitled "Heat Flux Sensored by Depositing Electrically Conductive Ink in Substrate Trough-Holes as One or Both of the Thermophile Materials" filed on 3 Dec. 2015, the contents of which are incorporated herein by reference in its entirety.

COPYRIGHT NOTICE

A portion of the disclosure of this patent document may contain material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

BACKGROUND OF THE INVENTION

This invention relates to an apparatus for measuring the heat flux at the surface of a solid material. More particularly, the present invention relates to a particular configuration of heat flux gage made by plating thermocouple materials through holes in a thermal resistance layer.

Heat flux is defined as the rate of heat flow per unit area into or out of a surface. Because of the increasing scrutiny of energy use, measurement of heat flux is becoming more important. Heat flux sensors are consequently coming into much more demand. Current heat flux sensors with manufacturers are listed in the review paper by T. E. Diller, published in 2014, titled "Heat Flux". Diller, T. E., "Heat Flux," Ch. 67, in *Measurement, Instrumentation and Sensors Handbook*, Eds. J. G. Webster and H. Eren, CRC Press, Boca Raton, Fla., 2014, pp. 67.1-15.

Because most heat flux sensors are painstakingly made by hand, the need for mass production is becoming apparent. The current invention is designed to meet this need by using a semi-automated process to produce reliable and reproducible sensors in larger quantities at much lower cost. This represents a major disruption of the commercial market and provides the opportunity to greatly expand the application of heat flux sensors for the benefit of industry and society.

As described in the ASTM standard (2684-09) for measuring heat flux at a surface, most of the methods use temperature measurements normal to the surface by placing a sensor that measures a temperature difference on the surface. ASTM E2684-09, Standard Test Method for Measuring Heat Flux Using Surface-Mounted One-Dimensional Flat Gages. *Ann. Book ASTM Standards*, 15.03, 2009. As with any good sensor design, the goal for good measurements must be to minimize the disruption caused by the presence of the sensor. As described in the review paper by T. E. Diller published in 2013, it is particularly important to understand the thermal disruption caused by the sensor because it cannot be readily visualized and because all heat flux sensors have a temperature change associated with the measurement. Diller, T. E., "Heat Flux Measurement," Ch. 18, in *Handbook of Measurement in Science and Engineering*, Ed. M. Kutz, John Wiley & Sons, N Y, 2013, pp. 629-659. Consequently, wise selection of the sensor design and operating range is important for good heat flux measurements.

A simple heat flux sensor concept for mounting on a surface involves a layer of thermal resistance with a temperature sensor T1 on one side and a second temperature sensor T2 on the opposing side of the sensor, which has a sensor thickness δ. The one-dimensional heat flux perpendicular to the surface is found from Equation 1 for steady-state conditions:

$$q'' = \frac{k}{\delta}(T_1 - T_2) \qquad \text{Equation 1}$$

The thickness of the sensor 6 and thermal conductivity k are not known with sufficient accuracy for any particular sensor to preclude direct calibrations of each sensor. An adhesive layer may also be required between the sensor and surface to securely attach the sensor, which adds an additional thermal resistance and increases the thermal disruption. Temperature measurements on the sensor and on the surrounding undisturbed material are recommended to quantify this disruption. The ASTM standard listed gives guidance on the use of these sensors.

Although the temperature difference can be measured by any number of methods, the most commonly used are thermocouples. Thermocouples have the advantage that they generate their own voltage output corresponding to the temperature difference between two junctions. Consequently, they can be connected in series to form a thermopile that amplifies the output from a given temperature difference, which is the method described in U.S. Pat. No. 3,607,445 issued to Hines. Most any pair of conductors that are thermoelectrically different (e.g., copper-constantan) can be used for the legs of the thermopile, but the output leads should be of the same material so that additional thermocouple junctions are not created. The voltage output, E, is simply:

$$E = NS_T(T_1 - T_2) \qquad \text{Equation 2:}$$

N represents the number of thermocouple junction pairs, and $S_T$ is the Seebeck coefficient or thermoelectric sensitivity of the materials, expressed in volts per degree Centigrade. The corresponding sensitivity of the heat flux sensor is:

$$S = \frac{E}{q''} = \frac{NS_T\delta}{k} \qquad \text{Equation 3}$$

Although the sensitivity is determined in practice from a direct calibration, the last part of the equation can be used to determine the effects of different parameters for design purposes.

Examples of one-dimensional flat (or planar) sensors can be categorized based on their basic design and construction. Some gages were made by wrapping thermocouples around a resistive layer. Examples of patents incorporating these designs exist. U.S. Pat. No. 6,186,661, issued to Hevey et al., used constantan wire partially plated with copper, and U.S. Pat. No. 3,607,445, issued to Hines, used metal films that were butt-welded on each side.

Another example involves gages made by layering thermocouple and resistive layers onto one side of a substrate. The deposition process can be different; however, this design is illustrated by several patents. U.S. Pat. No. 4,779,994 issued to Diller et al. used sputtering, U.S. Pat. No. 6,278,051 issued to Peabody used metallic inks, U.S. Pat.

No. 5,990,412 issued to Terrell used metallic inks, U.S. Patent Application No. US20040136434 of Langley used laminated layers, U.S. Patent Application No. US 20050105582 A1 of Thery used attached layers, and U.S. Patent Application No. US 20150308906 A1 of Durer et al. used semi-conductor materials mounted onto the substrate.

Further example Gages made with a separate temperature measurement on either side of the thermal resistive layer use RTD's (resistance temperature devices). They are not as useful for measuring heat flux as thermocouples, but have been patented by Epstein et al. in U.S. Pat. No. 4,722,609, Hayashi et al. in U.S. Pat. No. 4,577,976, and Jae-Wook Yoo in U.S. Pat. No. 8,104,952 B2.

Yet another example, thermocouples are deposited along a surface, the heat flux is measured along the surface, rather than perpendicular to it. These are generally not useful for measuring heat flux to or from a surface. Patents based on this concept include U.S. Pat. No. 6,821,015 issued to Hammer, U.S. Pat. No. 5,393,351 issued to Kinard et al., U.S. Pat. No. 9,127,988 issued to Ikeda et al., and U.S. Pat. No. 8,016,480 B2 issued to Lozinski.

A heat flux gage made by plating thermocouple materials through holes in a thermal resistance layer to connect from one side to the other have been used with copper and nickel for the thermocouple materials. The patent by U.S. Pat. No. 4,198,738 issued to Degenne discussed using metal coatings of orifices in a substratum connecting to plates on either side. The resulting gages (using copper and nickel coatings on 2.5 mm thick sheets of epoxy glass), however, were impractical because of their large size and low sensitivity. Degenne, M. and Klarsfeld, S., "A New Type of Heat Flowmeter for Application and Study of Insulation and Systems," in *Building Applications of Heat Flux Transducers, ASTM STP* 885, Eds. E. Bales, M. Bomberg, and G. E. Courville, ASTM, Philadelphia, 1985, pp. 163-171.

SUMMARY OF THE INVENTION

The present invention relates to a particular configuration of heat flux gage made by printing and/or plating thermocouple materials through holes in a thermal resistance layer. The last category of the one-dimensional heat flux sensors is to use holes through the thermal resistance sheet to connect the thermocouple junctions from one side to the other. The key to making a useful heat flux gage of this type is to print at least one of the thermocouple materials as a metallic ink through the holes. Two different thermocouple materials are alternated through the holes and along the surface. This can be accomplished using two or three different thermocouple materials in several arrangements. The third conductive metal can be used as an interconnect to complete the circuit between the materials in the holes. Alternatively, either one of the thermocouple materials used through the holes can also be used as the interconnect to complete the circuit. The thermocouple materials may be deposited by a combination of plating, etching laminated layers or metallic ink printing to form the differential thermopile across the substrate.

An aspect of the present design is to provide a heat flux gage that has a significant decrease in the cost of production while maintaining acceptable performance characteristics.

Another aspect of the present design is to provide heat flux gage that can be used to provide analysis of the heat transfer and paradigm of various devices and systems, including but not limited to, HVAC systems, insulation analysis, refrigeration systems, and the like.

A further aspect of the present design is to reduce time response and minimize thermal resistance. Thin-film sensors have the advantage of minimum thermal resistance and increased speed of data acquisition due to their smaller/ thinner size.

These and other aspects of the present invention will become readily apparent upon further review of the following drawings and specification.

BRIEF DESCRIPTION OF THE DRAWINGS

The novel features of the described embodiments are specifically set forth in the appended claims; however, embodiments relating to the structure and process of making the present invention, may best be understood with reference to the following description and accompanying drawings.

FIGS. 4A-4B show a plan view of the pattern of two printed inks including a first material and a second material respectively on the top surface of the substrate.

Similar reference characters denote corresponding features consistently throughout the attached drawings.

DETAILED DESCRIPTION OF PREFERRED EMBODIMENTS

Figure 1A:
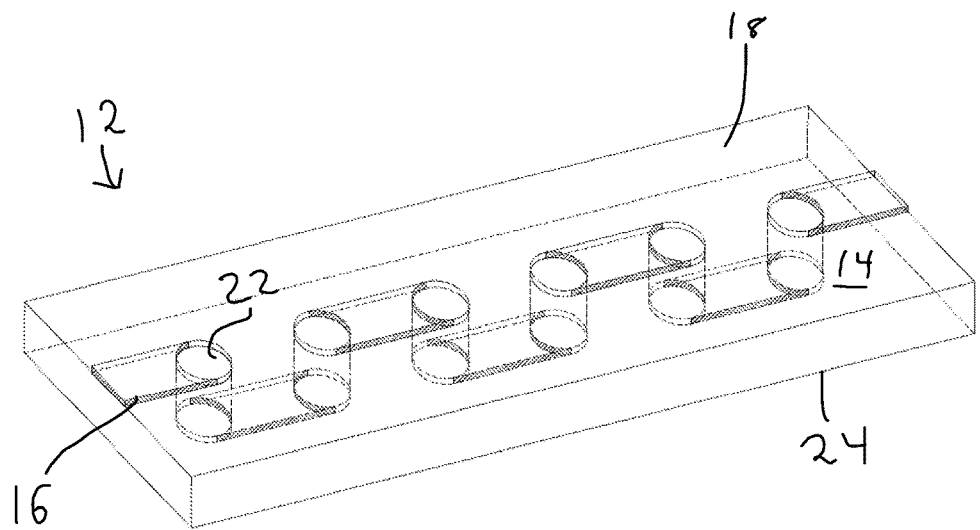
FIGS. 1A-1B show a three-dimensional sketch of the heat flux gage unexploded and exploded respectively according to the present design.

A heat flux gage 12 for measurement of heat transfer to or from a surface has an electrically insulating sheet 14 with holes made through the sheet 14. The heat flux gage 12 has a metal interconnect layer 16 on the top surface 18 that is connected through a hole 20 to an interconnect layer 16 of the same material 22 on the bottom surface 24, or a metal interconnect layer 16 on the top surface 18 that is connected through a hole 20 to an interconnect layer 16 of a thermoelectrically different material 26 on the bottom surface 24. Alternatively, the heat flux gage 12 may have a plurality n of metal interconnect layers 16 on the top surface 18 that are connected through holes 20 to a plurality n of interconnect layers 16 of the same material 22 on the bottom surface 24, or a plurality n of metal interconnect layers 16 on the top surface 18 that are connected through holes 20 to interconnect layers 16 of a thermoelectrically different material 26 on the bottom surface 24.

The through hole 20 connection 28 is provided by a material 22 or 26 of the same or similar thermoelectric material 22 or 26 as the interconnects 16, or it is provided by a material 27 of the same or similar thermoelectric material 22 as the top 18 interconnect 16. A second metal of a thermoelectrically different material 27 than the first interconnect layer 16 is connected through a second hole 20 from the top side 18 interconnect 16 to the bottom side 24 interconnect 16'. Alternatively, a second through hole 20 connection 28' is provided by a metal of the same or similar thermoelectric material 26 as the interconnect layer 16 on the bottom side 24. The layers 16, 16' are connected in an alternating fashion to form a differential thermocouple.

The pattern is created by printing conductive metallic inks on the surfaces 18, 24 and through holes 20, or it is created by a combination of plating and etching processes and printing conductive metallic inks on the surfaces 18, 24 and through holes 20. A set of metal pads 30 for connecting wires 42 are provided. Plastic and metal coverings may be added to cover over the junctions.

Figure 1B:
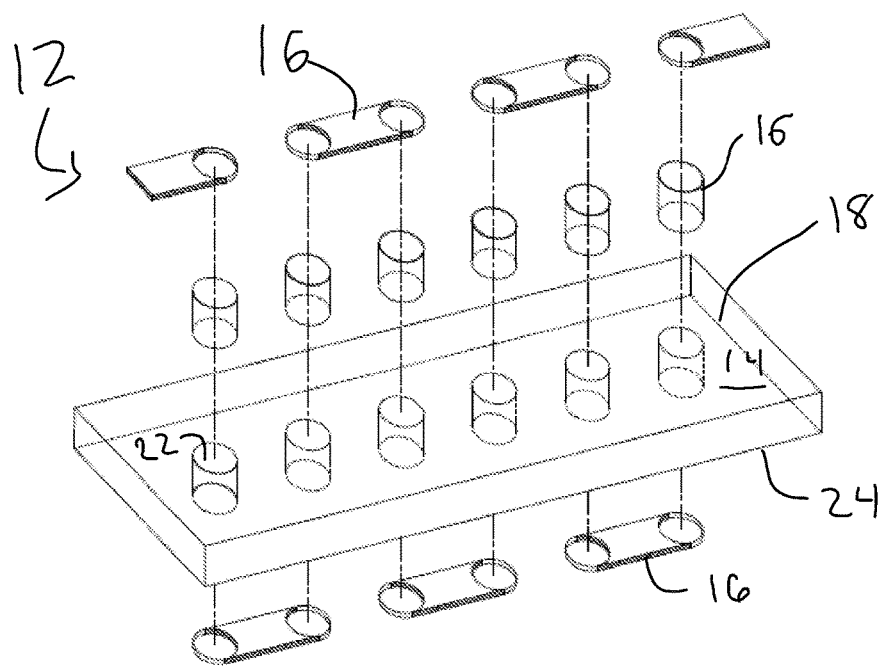

FIGS. 1A-1B shows a three-dimensional sketch of the heat flux gage 12. FIG. 1A shows an unexploded view of the heat flux gage 12, whiled FIG. 1B shows an exploded view of the same heat flux gage 12. The materials 22, 26, 27 through the holes 20 are shown in detail in FIGS. 2A-2D.

Figure 2A:
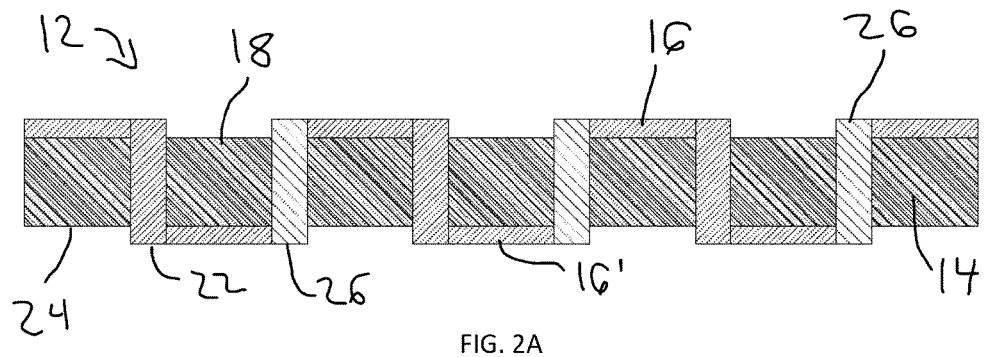
FIGS. 2A-2D show two-dimensional edge view of the heat flux gage demonstrating four possible arrangements of the present invention.
Figure 2B:
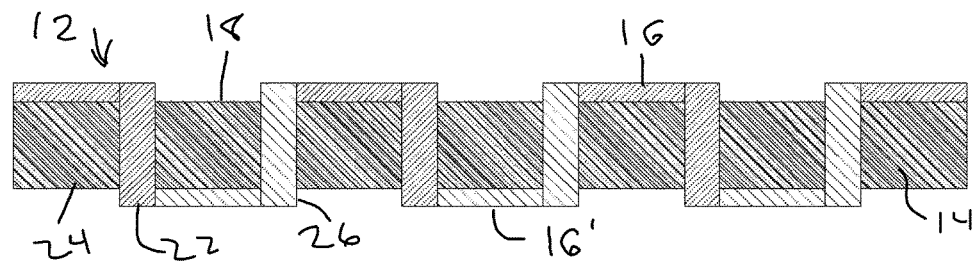
Figure 2C:
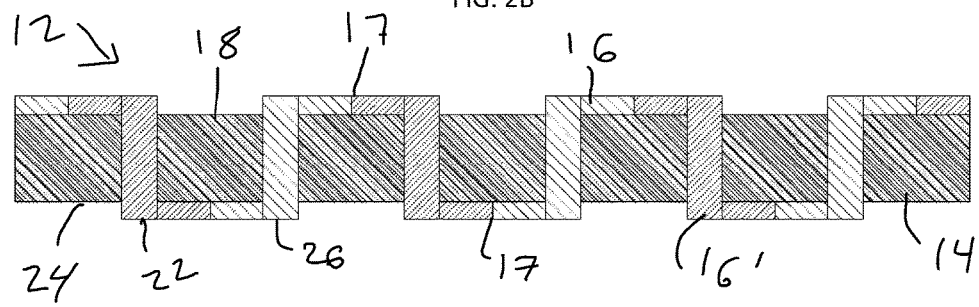
Figure 2D:
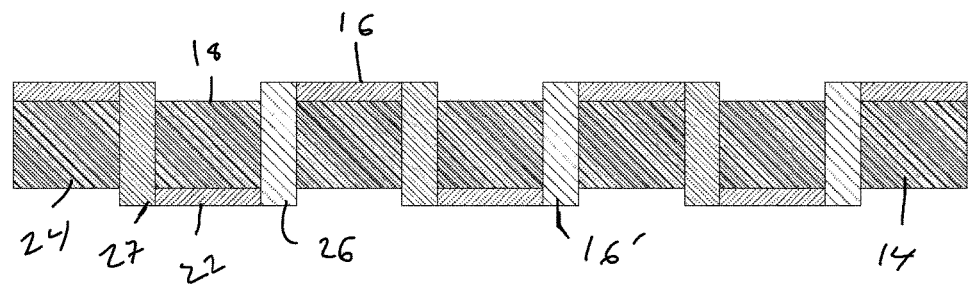

FIGS. 2A-2D show two-dimensional edge view of the heat flux gage 12 demonstrating four possible arrangements of the materials 22, 26, 27 of the present invention. FIG. 2A shows one thermocouple material 22 alternating through the holes 20 and a second thermocouple material 26 alternating through the holes 20 and used for the all the interconnects 16, 16' on the top and bottom surfaces 18 and 24. FIG. 2B shows a heat flux gage 12 with two thermocouple materials 22, 26 alternating both through the holes 20 and for the interconnects 16. 16' on the top and bottom surfaces 18 and 24. FIG. 2C shows heat flux gage 12 with two thermocouple materials 22, 26 through the holes 20 and as interconnects 16, 16' with junctions 17 midway between holes 20. FIG. 2D shows heat flux gage 12 with two different thermocouple materials 22, 26 through the holes 20 and a third material 27 for interconnects 16, 16' on the top and bottom surfaces 18 and 24.

Figure 3A:
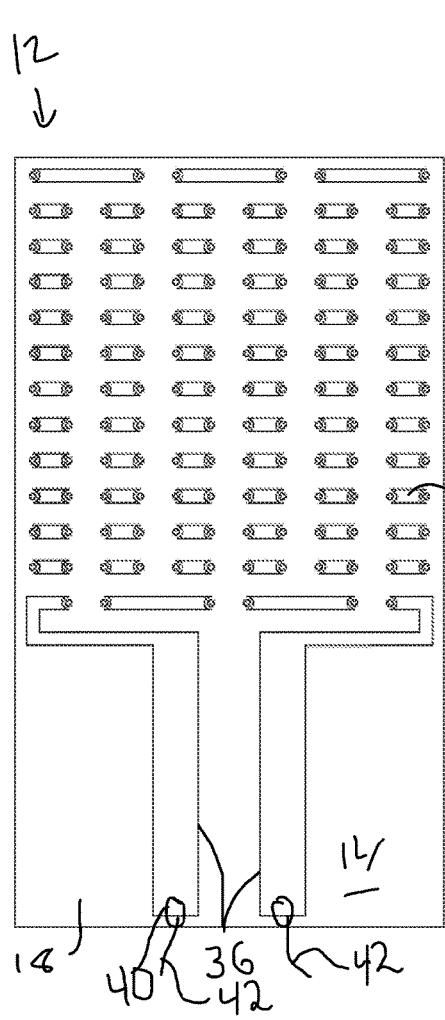
FIGS. 3A-3B show a plan view of the metallic interconnect trace designs and holes for both the top and bottom surfaces respectively of the heat flux gage.
Figure 3B:
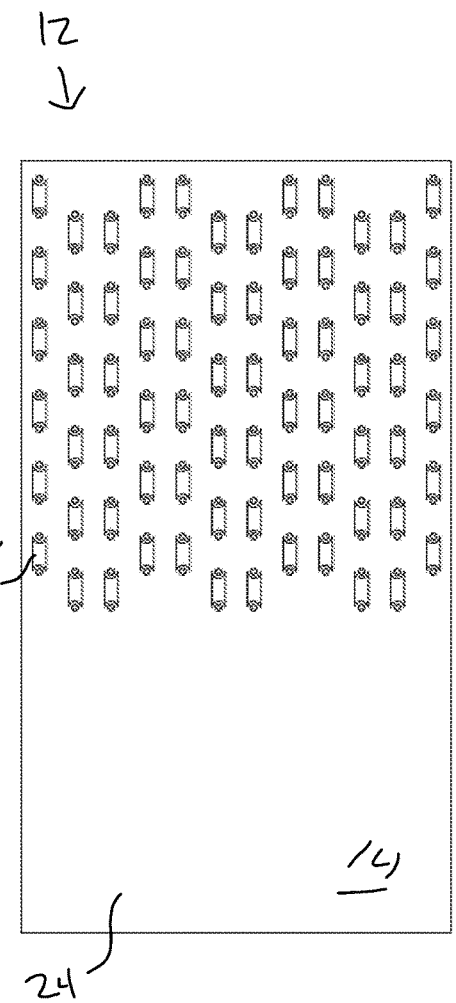

The manufacturing process used to produce the heat flux gage 12 begins with a double-sided copper cladded sheet 14 (e.g. Kapton). This is a sheet 14 with a thickness of copper cladding laminated on either side. Using copper etching, the double-sided copper is patterned into circuit traces 16, 16'. FIGS. 3A-3B show a plan view of the metallic interconnect trace 16, 16' designs and holes 20 for both the top and bottom surfaces 18 and 24 respectively of the heat flux gage 12.

Figures 5A, 5B:
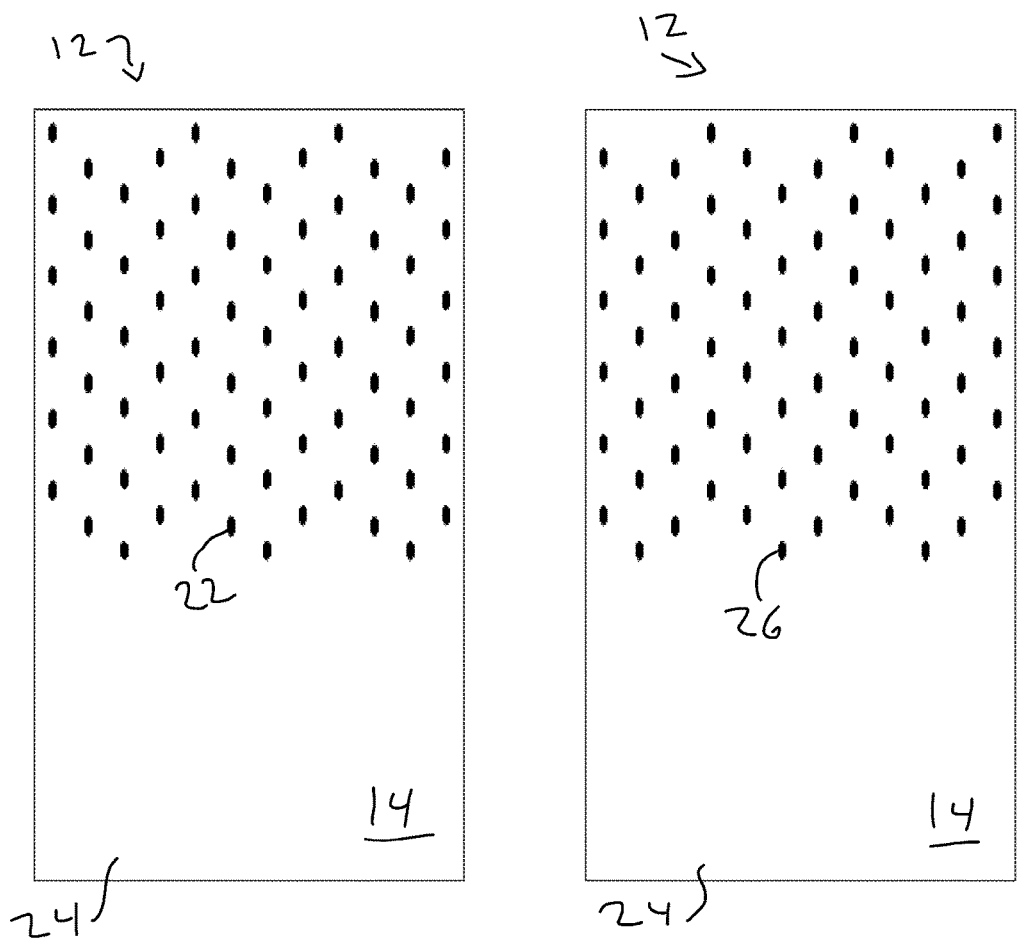
FIGS. 5A-5B show a pattern of two printed inks first material and second material respectively on the bottom surface of the surface of the substrate sheet.

During the next step, holes 20 are made through the sheet 14 (using laser cutting, mechanical drilling or chemical etching). These holes 20 are used to provide connections from the top to bottom surfaces 18 and 24 using the thermopile materials 22, 26, or 27. Two thermoelectrically different inks (such as silver and nickel) are printed in the patterns shown in FIGS. 4A-4B and 5A-5B on the two sides of the sheet 14 and through the holes 20. FIGS. 4A-4B show a plan view of the pattern of two printed inks including a first material 22 and a second material 26 respectively on the top surface 18 of the substrate 14. The material 22, 26 not only fills the holes 20, but also overlaps on both the top and bottom sides 18 and 24 to connect with the copper interconnect traces 16, 16'. Each ink layer is cured before the other is printed. An alternative to the silver ink is to plate copper through the corresponding holes 20. FIGS. 5A-5B show a pattern of two printed inks first material 22 and second material 26 respectively on the bottom surface 24 of the substrate sheet 14.

Measurement pads 36, consisting of metal traces, extend outside the sensing area to provide soldering points 40 for wires 42 of the same material 22, 26, 27 as the interconnect traces 16 used for heat flux voltage measurements. An additional wire (not shown) of a different thermocouple material 22, 26, 27 can be soldered to one of the measurement pads 36 to create a single thermocouple to measure the sensor surface temperature. Thus, from a total of three wires 42, it is possible to determine heat flux absorbed by the sensor as well as sensor surface temperature. Alternatively, a two-wire thermocouple can be attached to the pads 36 to read the surface temperature. Any combination of the listed thermocouple elements can be used for the thermocouple.

The voltage leads are connected to the measurement pads 36 located close to one another so that it can be assumed the lead connections are at the same temperature. This ensures the voltage leads experience the same temperature gradient from the measurement pads 36 to the voltage measurement location so the influence of their thermoelectric voltages is negated. The interconnect traces 16 within the sensing area circuit are used to provide stable electrical jumper connections from one hole 20 to the next. If the interconnect trace 16, 16' metal is plated through the holes 20 to connect between the top and bottom of the sensor in place of one of the printed inks, then it will form part of the thermocouple measurement because it experiences a temperature gradient.

An example of a heat flux gage 12 was made, and had two leads which were soldered to the base of the measurement pads for heat flux voltage measurement. The completed heat flux gage 12 used printed inks on top and on bottom surfaces 18 and 24 which are consistent with FIGS. 4A-4B and FIGS. 5A-5B. The printed inks were black and silver materials. Two copper leads were soldered to the base of the measurement pads for heat flux voltage measurement. A constantan wire was soldered to one measurement pad to provide a type-T thermocouple temperature measurement.

The last step in manufacturing the heat flux gage 12 is to electrically encapsulate the sensor by adhering a thin film to both the top and bottom surfaces 18 and 24. In addition, thin metallic sheets may be adhered to the sensor on one or both sides to give more rigidity and to prevent unnecessary bending of the sensor. The metallic sheet encapsulation may also be useful in creating uniform temperatures on the gage 12 surfaces 18 and 24.

Figure 6:
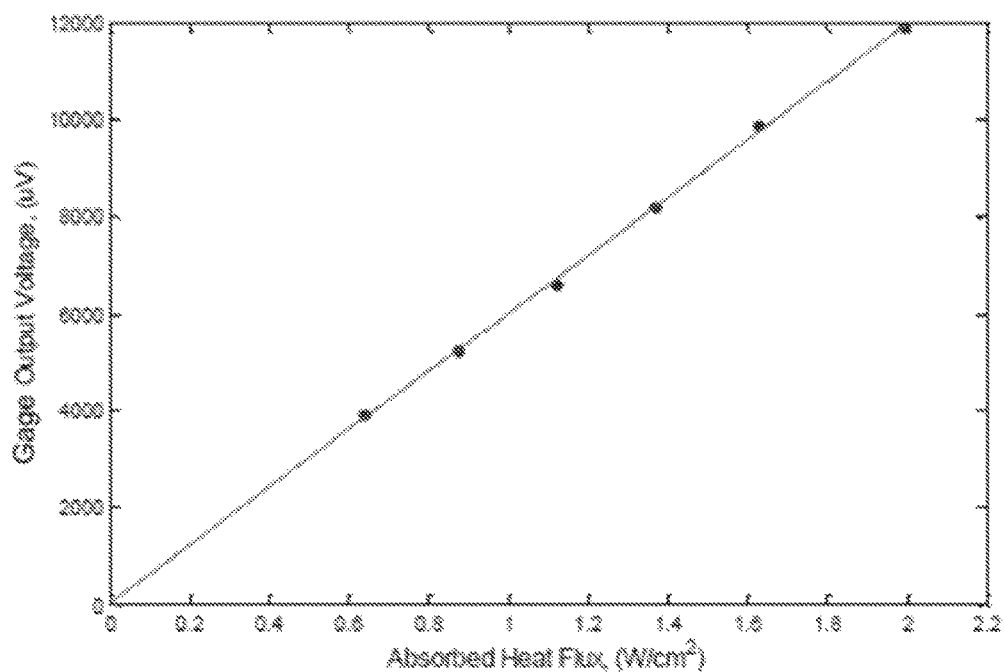
FIG. 6 is a graph of the heat flux gage voltage output as a function of absorbed heat flux.

Calibration is performed in relation to a known standard. This can be done using convection, radiation, or conduction or a combination of these modes. A known heat flux is provided to the gage 12 at steady-state conditions and the output voltage is recorded. This is usually done over a range of heat flux values typical of the standard operating range of the sensor. An example calibration plot is shown in FIG. 6. The average slope of the line through the points is the sensitivity of the gage 12. FIG. 6 is a graph of the heat flux gage 12 voltage output as a function of absorbed heat flux while mounted in a radiation calibration system. Averaged measurements during six steady-state radiative heat flux events are shown by markers. The slope of the least squares regression line for these measurements is the sensor sensitivity with a value of 3.57 $(mV/(W/m^2))$ for this particular heat flux gage 12.

The heat flux gage 12 design utilizes a differential thermopile arrangement that measures the temperature difference across a sheet 14 of material that is a non-electrical conductor. A nonexclusive partial list of the possible substrate sheet 14 materials includes FR-4, anodized aluminum, mylar, polyimide, polyester, silicone, anodized metal, kapton, rubber, glass, plastic, silica, paper, thermoplastics, ceramics, PVC (Polyvinylcloride), teflon, A.B.S. (Acrylonitrile, butadiene, and styrene), acetate, acrylic, polycarbonate, delrin, epoxy, fiberglass, FEP thermoplastic, fiberglass laminates, G-10, epoxy-fiberglass laminates, G-11, G-5, G-9, G-7, melamine, silicone-glass, high impact polystyrene (HIPS), FR-5, FR-6, kynar, macor, meldin, mica, neoprene, nomex, noryl, nylon, peek (polyetherether-ketone), P.E.T. (polyethylene terephthalate), P.E.T.G., phenolics, micarta phenolic, PFA (PerFluoroAlkoxy), POLYOLEFINS, POLY- STYRENE, POLYSULFONE, POLYURETHANE, rexolite, ryton, silicone rubber, techtron, ultem, polyetherimide, vinyl.

The thermocouple materials consist of two electrically conductive inks that are thermoelectrically different. They are patterned onto the substrate sheet 14 and through the holes 20 of the substrate 14 using a printing process. Electrically conductive ink is defined as a liquid with electrically conductive particles suspended within. The ink is cured from a liquid into a solid form after being patterned on the substrate 14. A partial list of possible materials 22, 26, 27 to use as the thermocouple elements in the ink is: Antimony, bismuth, bismuth telluride, antimony tellurium, nickel, silver, carbon, copper, selenium, tellurium, silicon, germanium, nichrome, molybdenum, cadium, tungsten, gold, brass, bronze, graphite, rhodium, calcium, sodium, chromium, titanium, manganese, tantalum, lead, tin, magnesium, mercury, iron, aluminum, carbon mercury, platinum, sodium, potassium, constantan, or any combination of these together or alloy/variation of these.

Another variation is to use metal plating to connect through the substrate holes 20 to the metal interconnects 16 on the top and bottom surfaces 18 and 24. The interconnect trace 16 pattern zig-zags side to side so that the thermocouple pairs are as close as possible to one another to minimize error caused by a one-dimensional heat flux assumption. The interconnects 16, 16' are etched laminated metal layers to provide the detailed pattern desired. A list of possible materials 22, 26, 27 for metal layers and plating thermocouple elements is: copper, nickel, silver, gold, tin, tin-lead alloy, brass, cadmium, palladium, zinc, rhodium, chromium, zinc, nickel-cobalt, tungsten carbide, silicon carbide, chromium carbide, aluminum oxide, platinum, lead, antimony, bismuth, bismuth telluride, antimony tellurium, carbon, selenium, tellurium, silicon, germanium, nichrome, molybdenum, tungsten, gold, brass, bronze, graphite, rhodium, calcium, sodium, titanium, manganese, tantalum, lead, tin, magnesium, mercury, iron, aluminum, carbon mercury, platinum, sodium, potassium, constantan, or any combination of these together or alloy/variation of these.

It is to be understood that the present invention is not limited to the embodiments described above, but encompasses any and all embodiments within the scope of the following claims.

What is claimed is:

1. A heat flux gage for measurement of heat transfer to or from a surface, comprising:
   an electrically insulating sheet with holes made through the sheet;
   at least one of a metal top interconnect layer on the top surface that is connected through a hole to a bottom interconnect layer of the same material on the bottom surface, and a metal top interconnect layer on the top surface that is connected through a hole to a bottom interconnect layer of a thermoelectrically different material on the bottom surface, and a plurality n of metal top interconnect layers on the top surface that are connected through holes to a plurality n of bottom interconnect layers of the same material on the bottom surface, and a plurality n of metal top interconnect layers on the top surface that are connected through holes to a plurality n of bottom interconnect layers of a thermoelectrically different material on the bottom surface;
   the through hole connection is provided by a material of the same or similar thermoelectric material as the top and bottom interconnect layers, or the through hole connection is provided by a material of the same or similar thermoelectric material as the top interconnect layer;
   a second metal of a thermoelectrically different material than the first metal of the top interconnect layer that is connected through a second hole from the top side interconnect layer to the bottom side interconnect layer, or a second through hole connection is provided by a metal of the same or similar thermoelectric material as the bottom interconnect layer on the bottom surface side;
   the layers are connected in an alternating fashion to form a differential thermocouple; the pattern is created by printing conductive metallic inks on the surfaces and through holes, or the pattern is created by a combination of plating and etching processes and printing conductive metallic inks on the surfaces and through holes; and a set of metal pads for connecting wires.

2. The heat flux gage of claim 1, wherein:
   the metal top interconnect layer on the top surface that is connected through a hole to the bottom interconnect layer of the same material on the bottom surface;
   the through hole connection is provided by a material of the same or similar thermoelectric material as the top and bottom interconnect layers;
   the second metal of a thermoelectrically different material than the first metal of the top interconnect layer that is connected through a second hole from the top side interconnect layer to the bottom side interconnect layer; and the pattern is created by printing conductive metallic inks on the surfaces and through holes.

3. The heat flux gage of claim 1, wherein:
   the metal top interconnect layer on the top surface that is connected through a hole to the bottom interconnect layer of a thermoelectrically different material on the bottom surface;
   the through hole connection is provided by a material of the same or similar thermoelectric material as the metal of the top interconnect layer;
   the second through hole connection is provided by a metal of the same or similar thermoelectric material as the bottom interconnect layer on the bottom surface; and
   the pattern is created by printing conductive metallic inks on the surfaces and through holes.

4. The heat flux gage of claim 1, wherein:
   the metal top interconnect layer on the top surface that is connected through a hole to the bottom interconnect layer of the same material on the bottom surface;
   the through hole connection is provided by a material of the same or similar thermoelectric material as the top and bottom interconnects;
   the second metal of a thermoelectrically different material than the first metal of the top interconnect layer that is connected through a second hole from the top side interconnect to the bottom side interconnect; and the pattern is created by a combination of plating and etching processes and printing conductive metallic inks on the surfaces and through holes.

5. The heat flux gage of claim 1, wherein:
   the metal top interconnect layer on the top surface that is connected through a hole to the bottom interconnect layer of a thermoelectrically different material on the bottom surface;
   the through hole connection is provided by a material of the same or similar thermoelectric material as the metal of the top interconnect;

the second through hole connection is provided by a metal of the same or similar thermoelectric material as the bottom interconnect layer on the bottom surface; and the pattern is created by a combination of plating and etching processes and printing conductive metallic inks on the surfaces and through holes.

6. The heat flux gage of claim 1, wherein:

the plurality n of metal top interconnect layers on the top surface that are connected through holes to a plurality n of bottom interconnect layers of the same material on the bottom surface;

the through hole connections are provided by a material of the same or similar thermoelectric material as the top and bottom interconnects;

the second metal of a thermoelectrically different material than the first metal of the top interconnect layer that is connected through alternating holes from the top side interconnect layers to the bottom side interconnect layers; and the pattern is created by printing conductive metallic inks on the surfaces and through holes.

7. The heat flux gage of claim 1, wherein:

the plurality n of metal top interconnect layer on the top surface that are connected through holes to bottom interconnect layers of a thermoelectrically different material on the bottom surface;

the through hole connections are provided by a material of the same or similar thermoelectric material as the top interconnect layers;

the plurality n of alternating through hole connections are provided by a metal of the same or similar thermoelectric material as the bottom interconnect layers on the bottom surface; and the pattern is created by printing conductive metallic inks on the surfaces and through holes.

8. The heat flux gage of claim 1, wherein:

the plurality n of metal top interconnect layers on the top surface that are connected through holes to a plurality n of bottom interconnect layers of the same material on the bottom surface;

the through hole connections are provided by a material of the same or similar thermoelectric material as the top and bottom interconnects;

the second metal of a thermoelectrically different material than the first metal of the top interconnect layer that is connected through alternating holes from the top side interconnect layers to the bottom side interconnect layers; and the pattern is created by a combination of plating and etching processes and printing conductive metallic inks on the surfaces and through holes.

9. The heat flux gage of claim 1, wherein:

the plurality n of metal top interconnect layer on the top surface that are connected through holes to bottom interconnect layers of a thermoelectrically different material on the bottom surface;

the through hole connections are provided by a material of the same or similar thermoelectric material as the top interconnects;

the plurality n of alternating through hole connections are provided by a metal of the same or similar thermoelectric material as the metal of the bottom interconnect layers on the bottom side; and the pattern is created by a combination of plating and etching processes and printing conductive metallic inks on the surfaces and through holes.

10. The heat flux gage of claim 1, further comprising:

plastic and metal coverings added to cover over the junctions.

11. A heat flux gage for measurement of heat transfer to or from a surface, comprising:

an electrically insulating sheet with holes made through the sheet;

at least one of a metal top interconnect layer on the top surface that is connected through a hole to a bottom interconnect layer of the same material on the bottom surface, and a metal top interconnect layer on the top surface that is connected through a hole to a bottom interconnect layer of a thermoelectrically different material on the bottom surface, and a plurality n of metal top interconnect layers on the top surface that are connected through holes to a plurality n of bottom interconnect layers of the same material on the bottom surface, and a plurality n of metal top interconnect layer on the top surface that are connected through holes to bottom interconnect layers of a thermoelectrically different material on the bottom surface;

the through hole connection is provided by a material of the same or similar thermoelectric material as the top and bottom interconnects, or the through hole connection is provided by a material of the same or similar thermoelectric material as the top interconnect layer;

a second metal of a thermoelectrically different material than the first metal of the top interconnect layer that is connected through a second hole from the top side interconnect layer to the bottom side interconnect layer, or a second through hole connection is provided by a metal of the same or similar thermoelectric material as the bottom interconnect layer on the bottom side;

the layers are connected in an alternating fashion to form a differential thermocouple;

the pattern is created by printing conductive metallic inks on the surfaces and through holes, or the pattern is created by a combination of plating and etching processes and printing conductive metallic inks on the surfaces and through holes; and a set of metal pads for connecting wires; and plastic and metal coverings added to cover over the junctions.

* * * * *